United States Patent
Umehara et al.

(10) Patent No.: US 12,173,151 B2
(45) Date of Patent: Dec. 24, 2024

(54) POLYPHENYLENE ETHER RESIN COMPOSITION, PREPREG USING SAME, FILM WITH RESIN, METAL FOIL WITH RESIN, METAL-CLAD LAMINATE AND WIRING BOARD

(71) Applicant: PANASONIC INTELLECTUAL PROPERTY MANAGEMENT CO., LTD., Osaka (JP)

(72) Inventors: Hiroaki Umehara, Fukushima (JP); Fumito Suzuki, Fukushima (JP); Jun Yasumoto, Osaka (JP); Hiroharu Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/517,442

(22) Filed: Nov. 22, 2023

(65) Prior Publication Data

US 2024/0084133 A1    Mar. 14, 2024

Related U.S. Application Data

(62) Division of application No. 16/957,232, filed as application No. PCT/JP2018/038418 on Oct. 16, 2018, now Pat. No. 11,866,580.

(30) Foreign Application Priority Data

Dec. 28, 2017  (JP) ................................ 2017-254635

(51) Int. Cl.
| | | |
|---|---|---|
| C08L 71/12 | (2006.01) | |
| C08J 5/24 | (2006.01) | |
| C08K 5/00 | (2006.01) | |
| C08K 5/3492 | (2006.01) | |

(52) U.S. Cl.
CPC .......... C08L 71/126 (2013.01); C08J 5/244 (2021.05); C08K 5/0025 (2013.01); C08K 5/34924 (2013.01); *C08L 2203/16* (2013.01); *C08L 2203/202* (2013.01); *C08L 2205/025* (2013.01); *C08L 2312/00* (2013.01)

(58) Field of Classification Search
CPC ......... B32B 15/08; B32B 27/00; B32B 27/26; B32B 5/00; C08F 299/02; C08G 65/485; C08J 2371/12; C08J 2471/12; C08J 5/244; C08K 5/0025; C08K 5/34924; C08L 71/12; C08L 71/126; C08L 2203/16; C08L 2203/202; C08L 2205/025; C08L 2312/00; H05K 1/03
See application file for complete search history.

(56) References Cited

U.S. PATENT DOCUMENTS

| | | |
|---|---|---|
| 2006/0041068 A1 | 2/2006 | Ohno et al. |
| 2012/0045955 A1 | 2/2012 | Boday et al. |
| 2014/0343232 A1 | 11/2014 | Boday et al. |
| 2015/0166788 A1 | 6/2015 | Li et al. |
| 2016/0145370 A1 | 5/2016 | Kitai et al. |
| 2016/0168378 A1 | 6/2016 | Umehara et al. |
| 2016/0244610 A1 | 8/2016 | Chen et al. |
| 2017/0029619 A1 | 2/2017 | Lin et al. |
| 2017/0174835 A1 | 6/2017 | Hsieh et al. |
| 2017/0260365 A1 | 9/2017 | Liu et al. |
| 2018/0077796 A1 | 3/2018 | Boday et al. |
| 2018/0215971 A1 | 8/2018 | Chen et al. |
| 2018/0312683 A1 | 11/2018 | Umehara et al. |
| 2019/0300639 A1 | 10/2019 | Kitai et al. |
| 2020/0283615 A1 | 9/2020 | Umehara et al. |

FOREIGN PATENT DOCUMENTS

| | | |
|---|---|---|
| CN | 105358595 A | 2/2016 |
| CN | 105694425 A | 6/2016 |
| CN | 106398173 A | 2/2017 |
| CN | 107163244 A | 9/2017 |
| JP | 2005-292413 A | 10/2005 |
| JP | 2006-083364 A | 3/2006 |
| JP | 2016-531959 A | 10/2016 |
| JP | 2017-128718 A | 7/2017 |
| TW | 201731954 A | 9/2017 |
| WO | 2017/067123 A1 | 4/2017 |

OTHER PUBLICATIONS

ISR issued in WIPO Patent Application No. PCT/JP2018/038418, dated Dec. 18, 2018, English translation.
Office Action issued in U.S. Appl. No. 16/957,232, filed Jun. 24, 2022.
Office Action issued in U.S. Appl. No. 16/957,232, filed Dec. 2, 2022.
Office Action issued in U.S. Appl. No. 16/957,232, filed Mar. 16, 2023.
NOA issued in U.S. Appl. No. 16/957,232, filed Aug. 23, 2023.

*Primary Examiner* — Ana L. Woodward
(74) *Attorney, Agent, or Firm* — GREENBLUM & BERNSTEIN, P.L.C.

(57) ABSTRACT

One aspect of the present application relates to a polyphenylene ether resin composition including a modified polyphenylene ether compound (A) that is terminally modified with a substituent having a carbon-carbon unsaturated double bond, and a crosslinking-type curing agent (B) having two or more carbon-carbon unsaturated double bonds in each molecule, the modified polyphenylene ether compound (A) including a modified polyphenylene ether compound (A-1) having a specific structure, and a modified polyphenylene ether compound (A-2) having a specific structure.

12 Claims, 5 Drawing Sheets

POLYPHENYLENE ETHER RESIN COMPOSITION, PREPREG USING SAME, FILM WITH RESIN, METAL FOIL WITH RESIN, METAL-CLAD LAMINATE AND WIRING BOARD

This application is a Divisional of U.S. patent application Ser. No. 16/957,232 filed Jun. 23, 2020, which is a National Stage Entry of International Patent Application No. PCT/JP2018/038418 filed Oct. 16, 2018, and which claims the benefit of Japanese Patent Application No. 2017-254635 filed Dec. 28, 2017. The disclosure of each of the applications listed above is incorporated by reference herein in their entirety.

TECHNICAL FIELD

The present invention relates to a polyphenylene ether resin composition, and a prepreg, a film with resin, a metal foil with resin, a metal-clad laminate and a wiring board using the polyphenylene ether resin composition.

BACKGROUND ART

Recently, in various electronic devices, increase in information throughput has led to rapid development in mounting technology such as heightening of integration, densifying of wiring, and multi-layering of a semiconductor device to be mounted. A substrate material for forming a base material of a printed wiring board used in various electronic devices is requested to have low dielectric constant and dielectric loss tangent so as to enhance the transmission rate of signals, and reduce the loss during signal transmission.

Polyphenylene ether (PPE) is known to be excellent in dielectric characteristics such as dielectric constant and dielectric loss tangent, and excellent in dielectric characteristics such as dielectric constant and dielectric loss tangent also in high frequency bands (high frequency region) including MHz bands to GHz bands. Therefore, use of polyphenylene ether, for example, as a molding material for high frequency has been considered. More specifically, polyphenylene ether is preferably used, for example, in a substrate material for forming a base material of a printed wiring board included in an electronic device that utilizes a high frequency band.

Meanwhile, when polyphenylene ether is used as a molding material of a substrate material or the like, not only excellent dielectric characteristics but also excellent heat resistance, adhesiveness and so on are required. For example, there has been reported that a resin composition having excellent dielectric characteristics and heat resistance can be provided by using a combination of a polyphenylene ether having a modified terminal, and a high molecular weight substance (Patent Literature 1).

Although dielectric characteristics and a certain degree of heat resistance would be obtained by the resin composition described in Patent Literature 1, further improvement in performances such as heat resistance, adhesiveness, and low coefficient of thermal expansion in addition to the dielectric characteristics is requested at a higher level for a substrate material in these days.

The present invention was devised in light of the aforementioned circumstances, and it is an object of the present invention to provide a polyphenylene ether resin composition having high heat resistance, high Tg, low coefficient of thermal expansion and adhesiveness, in addition to low dielectric characteristics. It is also an object of the present invention to provide a prepreg, a film with resin, a metal foil with resin, a metal-clad laminate, and a wiring board using the resin composition.

CITATION LIST

Patent Literature

Patent Literature 1: JP2006-83364A

SUMMARY OF INVENTION

A polyphenylene ether resin composition according to one aspect of the present invention includes:

an modified polyphenylene ether compound (A) that is terminally modified with a substituent having a carbon-carbon unsaturated double bond, and a crosslinking-type curing agent (B) having two or more carbon-carbon unsaturated double bonds in each molecule, the modified polyphenylene ether compound (A) including a modified polyphenylene ether compound (A-1) represented by formula (1), and a modified polyphenylene ether compound (A-2) represented by formula (2).

[Chemical formula 1]

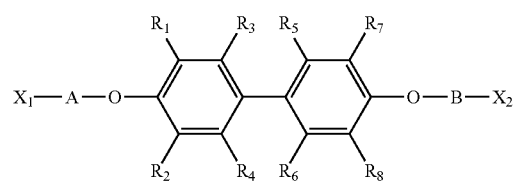

[Chemical formula 2]

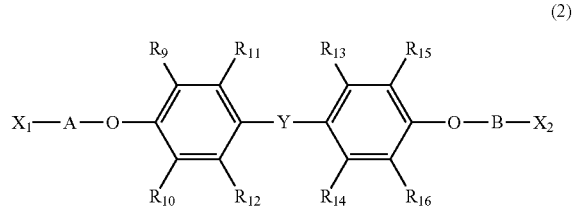

(In formulas (1) and (2), $R_1$ to $R_8$ and $R_9$ to $R_{16}$ each independently represent a hydrogen atom, an alkyl group, an alkenyl group, an alkynyl group, a formyl group, an alkylcarbonyl group. an alkenylcarbonyl group, or an alkynylcarbonyl group. Y represents a linear, branched, or cyclic hydrocarbon having 20 or less carbon atoms. $X_1$ and $X_2$, which may be the same or different from each other, represent a substituent having a carbon-carbon unsaturated double bond.

A and B respectively represent structures shown by formulas (3) and (4):

[Chemical formula 3]

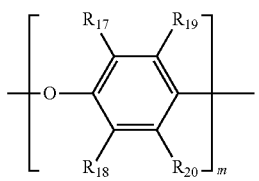

(3)

[Chemical formula 4]

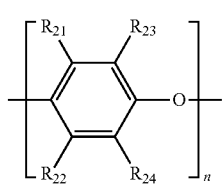

(4)

In formulas (3) and (4), m and n each represent an integer of 0 to 20. $R_{17}$ to $R_{20}$, and $R_{21}$ to $R_{24}$ each independently represent a hydrogen atom or an alkyl group.)

DESCRIPTION OF EMBODIMENTS

Figure 1:
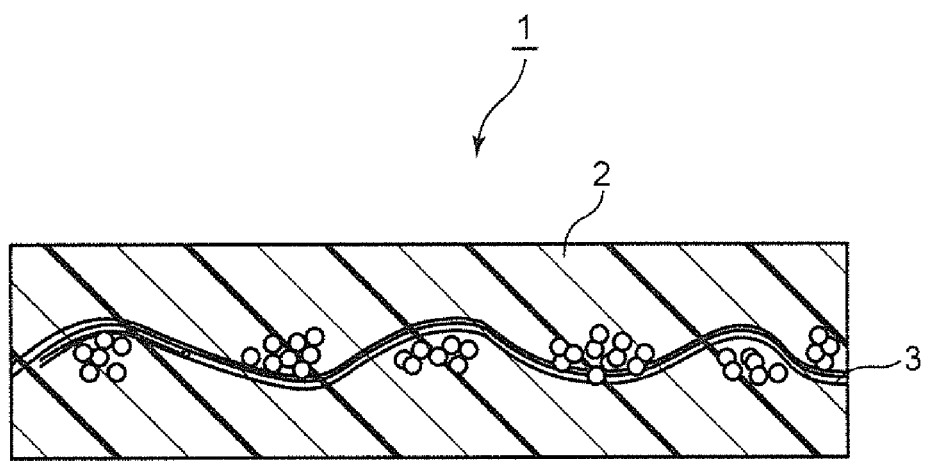
FIG. 1 is a schematic section view showing a configuration of a prepreg according to one embodiment of the present invention.

A polyphenylene ether resin composition according to an embodiment of the present invention includes:
a modified polyphenylene ether compound (A) that is terminally modified with a substituent having a carbon-carbon unsaturated double bond, and
a crosslinking-type curing agent (B) having two or more carbon-carbon unsaturated double bonds in each molecule,
the modified polyphenylene ether compound (A) including a modified polyphenylene ether compound (A-1) represented by formula (1), and a modified polyphenylene ether compound (A-2) represented by formula (2).

[Chemical formula 5]

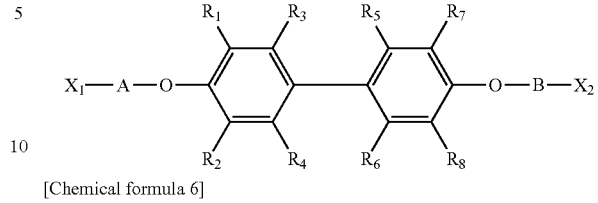

(1)

[Chemical formula 6]

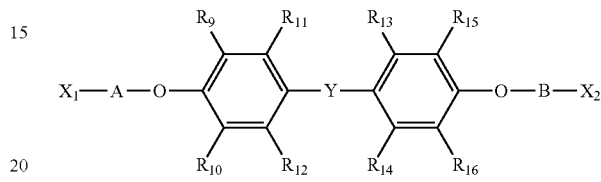

(2)

(In formulas (1) and (2), $R_1$ to $R_8$ and $R_9$ to $R_{16}$ each independently represent a hydrogen atom, an alkyl group, an alkenyl group, an alkynyl group, a formyl group, an alkylcarbonyl group, an alkenylcarbonyl group, or an alkynylcarbonyl group. Y represents a linear, branched, or cyclic hydrocarbon having 20 or less carbon atoms. $X_1$ and $X_2$, which may be the same or different from each other, represent a substituent having a carbon-carbon unsaturated double bond.

A and B respectively represent structures shown by formulas (3) and (4):

[Chemical formula 7]

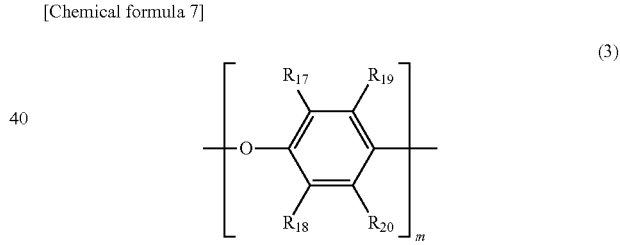

(3)

[Chemical formula 8]

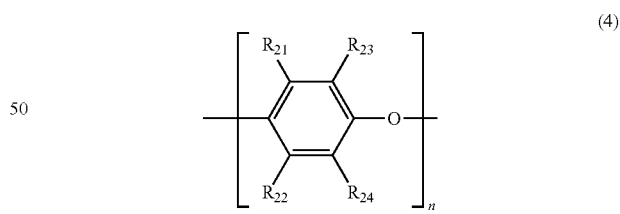

(4)

In formulas (3) and (4), m and n each represent an integer of 0 to 20. $R_{17}$ to $R_{20}$ and $R_{21}$ to $R_{24}$ each independently represent a hydrogen atom or an alkyl group.)

Since the polyphenylene ether resin composition includes two kinds of modified polyphenylene ether compounds as described above, the polyphenylene ether resin composition would have excellent heat resistance in addition to low dielectric characteristics such as low dielectric constant and low dielectric loss tangent, and has high Tg and adhesiveness.

Therefore, according to the present invention, it is possible to provide a polyphenylene ether resin composition having high heat resistance, high Tg and adhesiveness in addition to low dielectric characteristics such as low dielectric constant and low dielectric loss tangent. Also, the resin composition has excellent moldability, and has a low coefficient of thermal expansion.

Further, according to the present invention, by using the resin composition, it is possible to provide a prepreg, a film with resin, a metal foil with resin, a metal-clad laminate, and a wiring board having excellent performance.

Hereinafter, components of the polyphenylene ether resin composition according to the present embodiment (hereinafter, sometimes simply called "resin composition") are specifically described.

The modified polyphenylene ether compound (A) used in the present embodiment is not particularly limited as long as the modified polyphenylene ether compound (A) is a modified polyphenylene ether including the modified polyphenylene ether compound (A-1) represented by formula (1), and the modified polyphenylene ether compound (A-2) represented by formula (2).

In formula (1) and formula (2), $R_1$ to $R_8$, and $R_9$ to $R_{16}$ are independent of one another. In other words, $R_1$ to $R_8$, and $R_9$ to $R_{16}$ may be the same group or different groups. $R_1$ to $R_8$, and $R_9$ to $R_{16}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferred.

Regarding $R_1$ to $R_8$, and $R_9$ to $R_{16}$, specific examples of the functional groups recited above include the following.

Although the alkyl group is not particularly limited, for example, the alkyl group is preferably an alkyl group having 1 to 18 carbon atoms, and more preferably an alkyl group having 1 to 10 carbon atoms. Specific examples include a methyl group, an ethyl group, a propyl group, a hexyl group, and a decyl group.

Although the alkenyl group is not particularly limited, for example, the alkenyl group is preferably an alkenyl group having 2 to 18 carbon atoms, and more preferably an alkenyl group having 2 to 10 carbon atoms. Specific examples include a vinyl group, an allyl group, and a 3-butenyl group.

Although the alkynyl group is not particularly limited, for example, the alkynyl group is preferably an alkynyl group having 2 to 18 carbon atoms, and more preferably an alkynyl group having 2 to 10 carbon atoms. Specific examples include an ethynyl group, and a prop-2-yn-1-yl group (propargyl group).

Although the alkylcarbonyl group is not particularly limited as long as it is a carbonyl group substituted with an alkyl group, for example, the alkylcarbonyl group is preferably an alkylcarbonyl group having 2 to 18 carbon atoms, and more preferably an alkylcarbonyl group having 2 to 10 carbon atoms. Specific examples include an acetyl group, a propionyl group, a butyryl group, an isobutyryl group, a pivaloyl group, a hexanoyl group, an octanoyl group, and a cyclohexylcarbonyl group.

Although the alkenylcarbonyl group is not particularly limited as long as it is a carbonyl group substituted with an alkenyl group, for example, the alkenylcarbonyl group is preferably an alkenylcarbonyl group having 3 to 18 carbon atoms, and more preferably an alkenylcarbonyl group having 3 to 10 carbon atoms. Specific examples include an acryloyl group, a methacryloyl group and a crotonoyl group.

Although the alkynylcarbonyl group is not particularly limited as long as it is a carbonyl group substituted with an alkynyl group, for example, the alkynylcarbonyl group is preferably an alkynylcarbonyl group having 3 to 18 carbon atoms, and more preferably an alkynylcarbonyl group having 3 to 10 carbon atoms. Specific examples include a propioloyl group.

In formulas (1) and (2), A and B are structures respectively shown by formulas (3) and (4), as described above.

[Chemical formula 9]

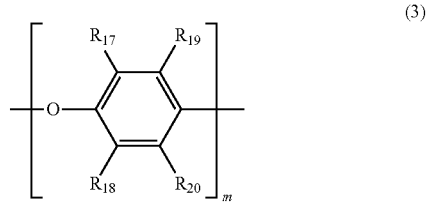

[Chemical formula 10]

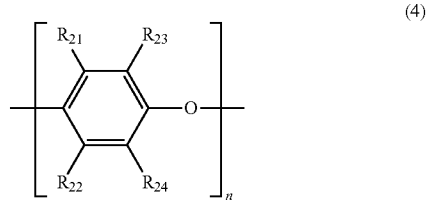

In formulas (3) and (4), m and n each represent an integer of 0 to 20. For example, it is preferred that the sum of m and n is 1 to 30. Also, m is preferably 0 to 20, and n is preferably 0 to 20. That is, it is preferred that m represents 0 to 20, n represents 0 to 20, and the sum of m and n represents 1 to 30.

$R_{17}$ to $R_{20}$ and $R_{21}$ to $R_{24}$ are independent of one another. In other words, $R_{17}$ to $R_{20}$ and $R_{21}$ to $R_{24}$ may be the same group or different groups. In the present embodiment, $R_{17}$ to $R_{20}$ and $R_{21}$ to $R_{24}$ each represent a hydrogen atom or an alkyl group.

Next, in formula (2), examples of Y include linear, branched or cyclic hydrocarbons having 20 or less carbon atoms. More specifically, examples include groups represented by formula (5).

[Chemical formula 11]

In formula (5), $R_{25}$ and $R_{26}$ each independently represent a hydrogen atom or an alkyl group. Examples of the alkyl group include a methyl group. Examples of the group represented by formula (5) include a methylene group, a methylmethylene group, and a dimethylmethylene group.

Further, in formulas (1) and (2), substituents represented by $X_1$ and $X_2$, which may be the same or different from each other, are preferably substituents having a carbon-carbon unsaturated double bond.

The substituent having a carbon-carbon unsaturated double bond is not particularly limited. Preferred specific examples of the substituents $X_1$ and $X_2$ include substituents represented by formula (6).

[Chemical formula 12]

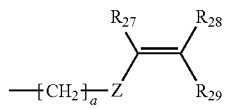
(6)

In formula (6), a represents an integer of 0 to 10. Z represents an arylene group. $R_{27}$ to $R_{29}$ each may independently be the same group or different groups, and each represent a hydrogen atom or an alkyl group. The alkyl group is not particularly limited, and, for example, the alkyl group is preferably an alkyl group having 1 to 18 carbon atoms, and more preferably an alkyl group having 1 to 10 carbon atoms. Specific examples include a methyl group, an ethyl group, a propyl group, a hexyl group, and a decyl group.

In formula (6), when a is 0, Z represents a moiety directly binding with a terminal of polyphenylene ether.

The arylene group is not particularly limited. Specific examples include monocyclic aromatic groups such as a phenylene group, and polycyclic aromatic groups in which the aromatic ring is not monocyclic but is polycyclic aromatic such as a naphthalene ring. The arylene group includes derivatives in which the hydrogen atom binding to the aromatic ring is substituted with a functional group such as an alkenyl group, an alkynyl group, a formyl group, an alkylcarbonyl group, an alkenylcarbonyl group, or an alkynylcarbonyl group.

Preferred specific examples of the substituent represented by formula (6) include functional groups including a vinylbenzyl group. Specific examples include substituents represented by formula (8).

[Chemical formula 13]

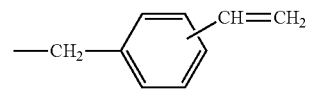
(8)

As a substituent other than those described above having a carbon-carbon unsaturated double bond with which terminal modification is made in the modified polyphenylene ether, a (meth)acrylate group, for example, represented by formula (7) is recited.

[Chemical formula 14]

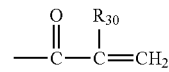
(7)

In formula (7), $R_{30}$ represents a hydrogen atom or an alkyl group. $R_{30}$ represents a hydrogen atom or an alkyl group. The alkyl group is not particularly limited, and, for example, the alkyl group is preferably an alkyl group having 1 to 18 carbon atoms, and more preferably an alkyl group having 1 to 10 carbon atoms. Specific examples include a methyl group, an ethyl group, a propyl group, a hexyl group, and a decyl group.

More specific examples of the substituents $X_1$ and $X_2$ in the present embodiment include vinylbenzyl groups (ethenylbenzyl group) such as a p-ethenylbenzyl group and a m-ethenylbenzyl group, a vinylphenyl group, an acrylate group, and a methacrylate group.

In the modified polyphenylene ether compound (A-1) and the modified polyphenylene ether compound (A-2), the substituents $X_1$ and $X_2$ may be the same or different from each other.

More specific examples of the modified polyphenylene ether compound (A-1) of the present embodiment include modified polyphenyleneethers represented by formula (9).

[Chemical formula 15]

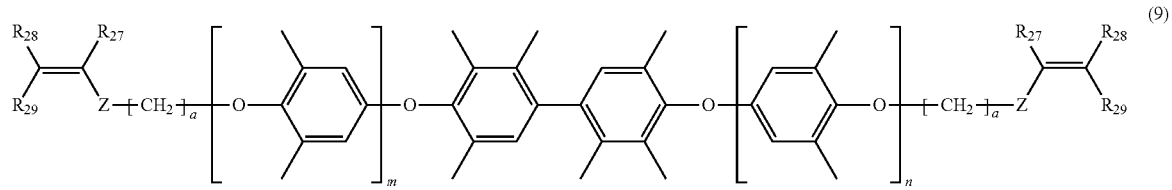
(9)

More specific examples of the modified polyphenylene ether compound (A-2) of the present embodiment include modified polyphenylene ethers represented by formula (10) to formula (11).

[Chemical formula 16]

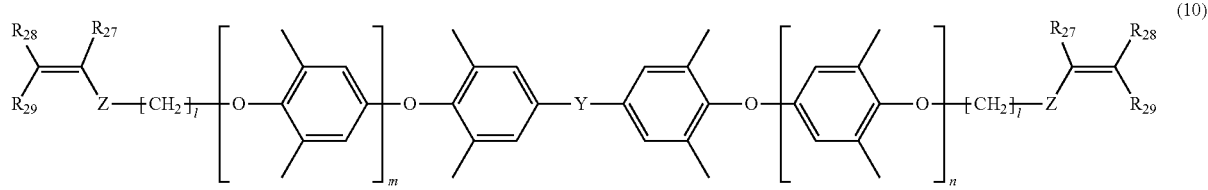

(10)

[Chemical formula 17]

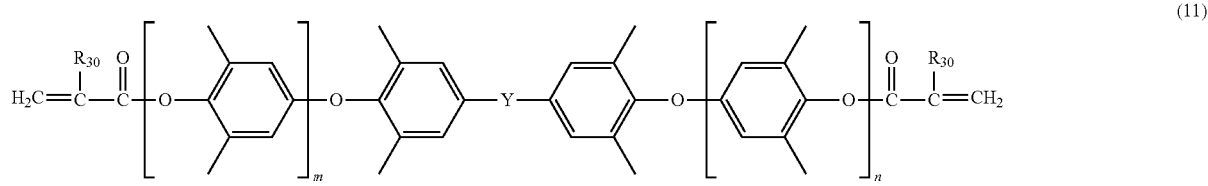

(11)

In formulas (9) to (11), Y is the same as Y in formula (2), $R_{27}$ to $R_{30}$ are respectively the same as $R_{27}$ to $R_{30}$ in formulas (6) and (7). Z and a are the same as Z and a in formula (6), and m and n are the same as m and n in formulas (3) and (4).

In the modified polyphenylene ether compound (A) of the present embodiment, it is preferred that a content ratio between the modified polyphenylene ether compound (A-1) and the modified polyphenylene ether compound (A-2) is (A-1):(A-2)=5:95 to 95:5 by mass ratio. Since the component (A-1) and the component (A-2) are contained in the above mass ratio, a resin composition having excellent heat resistance, Tg, and adhesive in good balance would be obtained. The mass ratio is more preferably 10:90 to 90:10, further preferably 10:90 to 70:30, and still more preferably 20:80 to 50:50.

A weight average molecular weight (Mw) of the modified polyphenylene ether compound used in the present embodiment is not particularly limited. Specifically, 500 to 5000 is preferred, 800 to 4000 is more preferred, and 1000 to 4000 is further preferred. The weight average molecular weight can be measured by an ordinary molecular weight measuring method, and is specifically, a value measured by gel permeation chromatography (GPC) and so on are recited. When the modified polyphenylene ether compound has a repeating unit represented by formula (2) in each molecule, it is preferred that m is a numerical value with which the weight average molecular weight of the modified polyphenylene ether compound falls within the above range. Specifically, it is preferred that m is 1 to 50.

When the weight average molecular weight of the modified polyphenylene ether compound falls within the above range, the modified polyphenylene ether compound has excellent dielectric characteristics peculiar to the polyphenylene ether, and is more excellent in heat resistance of the cured product, and is excellent in moldability. This would owe to the following reasons. In a normal polyphenylene ether, a polyphenylene ether having a weight average molecular weight falling within the above range has a relatively low molecular weight, so that the heat resistance of the cured product of the polyphenylene ether tends to decrease. In this respect, the modified polyphenylene ether compound according to the present embodiment has a carbon-carbon unsaturated double bond at a terminal, and shows high reactivity, and thus the cured product of the modified polyphenylene ether would have sufficiently high heat resistance. When the weight average molecular weight of the modified polyphenylene ether compound falls within the above range, the modified polyphenylene ether compound would have a relatively low molecular weight, and has excellent moldability. Therefore, such a modified polyphenylene ether compound would be excellent not only in heat resistance of the cured product, but also in moldability.

An average number of substituents (the number of terminal functional groups) in a molecule terminal per one molecule of the modified polyphenylene ether in the modified polyphenylene ether compound used in the present embodiment is not particularly limited. Specifically, 1 to 5 is preferred, 1 to 3 is more preferred, and 1.5 to 3 is further preferred. If the number of terminal functional groups is too small, there is a tendency that sufficient heat resistance of the cured product is difficult to be obtained. If the number of terminal functional groups is too large, the reactivity is too high, and, for example, the problems of deterioration in storage stability of the resin composition, and deterioration in fluidity of the resin composition can occur. That is, when such a modified polyphenylene ether is used, for example, molding defect such as generation of voids can occur at the time of multi-layer molding due to the insufficient fluidity or the like, and this can cause the problem in moldability of difficulty in obtaining a reliable printed wiring board.

The number of terminal functional groups of the modified polyphenylene ether compound can be a numerical value showing an average number of substituents per one molecule of all the modified polyphenylene ether compound existing in 1 mole of the modified polyphenylene ether compound. The number of terminal functional groups can be determined, for example, by measuring the number of hydroxyl groups remaining in the obtained modified polyphenylene ether compound, and calculating a decrement from the number of hydroxyl groups of the polyphenylene ether before modification. The decrement from the number of hydroxyl groups of the polyphenylene ether before modification is the number of terminal functional groups. The method for measuring the number of hydroxyl groups remaining in the modified polyphenylene ether compound may include adding a quaternary ammonium salt that associates with a hydroxyl group (tetraethylammonium hydroxide) to a solution of the modified polyether ether compound, and measuring the UV absorbance of the mixed solution.

Also, the intrinsic viscosity of the modified polyphenylene ether compound used in the present embodiment is not particularly limited. Specifically, the intrinsic viscosity may be 0.03 to 0.12 dl/g, preferably 0.04 to 0.11 dl/g, and more preferably 0.06 to 0.095 d/g. If the intrinsic viscosity is too low, the molecular weight tends to be low, and low dielectricity such as low dielectric constant and low dielectric loss tangent tends to be difficult to be obtained. If the intrinsic viscosity is too high, the viscosity is high, and sufficient fluidity is not obtained, and the moldability of the cured product tends to decrease. Therefore, when the intrinsic viscosity of the modified polyphenylene ether compound falls within the above range, excellent heat resistance and moldability of the cured product can be realized.

The intrinsic viscosity is an intrinsic viscosity measured in methylene chloride at 25° C., and more specifically, for example, a measurement value of a 0.18 g/45 ml methylene chloride solution (liquid temperature 25° C.) measured with a viscometer. As the viscometer, for example, AVS500 Visco System available from Schott can be recited.

A method for synthesizing the modified polyphenylene ether compound used in the present embodiment is not particularly limited as long as a modified polyphenylene ether compound that is terminally modified with substituents $X_1$ and $X_2$ as described above can be synthesized. Specifically, a method of reacting a compound in which substituents $X_1$ and $X_2$ and a halogen atom are bound, with polyphenylene ether can be recited.

The polyphenylene ether that is a starting material is not particularly limited as long as a specific modified polyphenylene ether can be finally synthesized. Specific examples include a polyphenylene ether composed of 2,6-dimethylphenol, and at least one of a bifunctional phenol and a trifunctional phenol, and those based on polyphenylene ether, such as poly(2,6-dimethyl-1,4-phenylene oxide). The bifunctional phenol means a phenol compound having two phenolic hydroxyl groups in each molecule, and, for example, tetramethylbisphenol A can be recited. The trifunctional phenol means a phenol compound having three phenolic hydroxyl groups in each molecule.

As one example of a method for synthesizing a modified polyphenylene ether compound, for example, in the case of modified polyphenylene ether compound (A-2), specifically, a polyphenylene ether as described above, and a compound in which substituents $X_1$ and $X_2$ and a halogen atom are bound (compound having substituents $X_1$ and $X_2$) are dissolved in the solvent and stirred. Thus, the polyphenylene ether, and the compound having substituents $X_1$ and $X_2$ react, and the modified polyphenylene ether to be used in the present embodiment is obtained.

It is preferred that the reaction is conducted in the presence of an alkali metal hydroxide. This would allow desired progression of the reaction. This is ascribable to that the alkali metal hydroxide functions as a dehalogenation agent, specifically as a dehydrochlorination agent. In other words, the alkali metal hydroxide eliminates hydrogen halide from the compound having a phenol group of polyphenylene ether and substituents $X_1$ and $X_2$, and thus the substituents X would bind to the oxygen atom of the phenol group in place of the hydrogen atom of the phenol group of the polyphenylene ether.

Although the alkali metal hydroxide is not particularly limited as long as it can serve as a dehalogenation agent, for example, sodium hydroxide is recited. The alkali metal hydroxide is usually used in the form of an aqueous solution, and specifically, used in the form of a sodium hydroxide aqueous solution.

The reaction conditions including the reaction time and the reaction temperature differ depending on the compound having substituents X, and are not particularly limited as long as the aforementioned reaction progresses desirably. Specifically, the reaction temperature is preferably room temperature to 100° C., more preferably 30 to 100° C. The reaction time is preferably 0.5 to 20 hours, and more preferably 0.5 to 10 hours.

The solvent used in the reaction is not particularly limited as long as it can dissolve polyphenylene ether, and the compound having substituents $X_1$ and $X_2$, and does not inhibit reaction between the polyphenylene ether, and the compound having substituents $X_1$ and $X_2$. Specific examples include toluene.

It is preferred that the aforementioned reaction is conducted in the presence of a phase transfer catalyst in addition to the alkali metal hydroxide. In other words, it is preferred that the aforementioned reaction is conducted in the presence of an alkali metal hydroxide and a phase transfer catalyst. This would allow more desired progression of the reaction. This would owe to the following reasons. This is ascribable to that the phase transfer catalyst is a catalyst that has a function of taking in the alkali metal hydroxide, and is soluble both in a phase of a polar solvent such as water, and in a phase of a nonpolar solvent such as an organic solvent, and is movable between these phases. Specifically, in the case where a sodium hydroxide aqueous solution is used as an alkali metal hydroxide, and an organic solvent such as toluene that is immiscible to water is used as a solvent, the solvent and the sodium hydroxide aqueous solution separate from each other even when the sodium hydroxide aqueous solution is dropped to the solvent being subjected to the reaction, and sodium hydroxide is difficult to migrate to the solvent. In such a case, the sodium hydroxide aqueous solution added as the alkali metal hydroxide would be less likely to contribute to acceleration of the reaction. On the other hand, when the reaction is conducted in the presence of the alkali metal hydroxide and the phase transfer catalyst, the alkali metal hydroxide migrates to the solvent while the alkali metal hydroxide is taken in the phase transfer catalyst, and the sodium hydroxide aqueous solution would be more likely to contribute to acceleration of the reaction. Therefore, the reaction would progress more desirably when the reaction is conducted in the presence of the alkali metal hydroxide and the phase transfer catalyst.

Although the phase transfer catalyst is not particularly limited, for example, quaternary ammonium salts such as tetra-n-butylammonium bromide are recited.

It is preferred that the resin composition according to the present embodiment contains a modified polyphenylene ether obtained in the manner as described above as the modified polyphenylene ether.

The resin composition of the present embodiment may contain a thermosetting resin other than the modified polyphenylene ether compound as described above. Examples of such other thermosetting resins that can be used include an epoxy resin, an unsaturated polyester resin, and a thermosetting polyimide resin.

In a preferred embodiment, it is desired that the thermosetting resin contained in the resin composition of the present embodiment is a resin containing a modified polyphenylene ether and a cross-linking agent. This would provide more excellent heat resistance and electric characteristics.

Next, (B) component used in the present embodiment, namely the crosslinking-type curing agent is described. The crosslinking-type curing agent used in the present embodiment is not particularly limited as long as it is a crosslinking-type curing agent having two or more carbon-carbon unsaturated double bonds in each molecule. That is, the crosslinking-type curing agent, when reacted with a modified polyphenylene ether compound, can cause formation of cross-links and cure the modified polyphenylene ether compound. The crosslinking-type curing agent is preferably a compound having two or more carbon-carbon unsaturated double bonds at a terminal.

The crosslinking-type curing agent used in the present embodiment has a weight average molecular weight of preferably 100 to 5000, more preferably 100 to 4000, further preferably 100 to 3000. If the weight average molecular weight of the crosslinking-type curing agent is too low, there is a possibility that the crosslinking-type curing agent becomes easy to volatilize from the blended component system of the resin composition. If the weight average molecular weight of the crosslinking-type curing agent is too high, there is a possibility that the viscosity of the varnish of the resin composition, and the melt viscosity at the time of heat molding are too high. Therefore, when the weight average molecular weight of the crosslinking-type curing agent falls within the above range, a resin composition that is more excellent in heat resistance of a cured product is obtained. This is ascribable to that cross-links can be desirably formed by the reaction with the modified polyphenylene ether compound. The weight average molecular weight can be measured by an ordinary molecular weight measuring method, and is specifically, a value measured by gel permeation chromatography (GPC) and so on are recited.

In the crosslinking-type curing agent used in the present embodiment, an average number of carbon-carbon unsaturated double bonds per one molecule of the crosslinking-type curing agent (number of terminal double bonds) is, for example, preferably 2 to 20, more preferably 2 to 18 although it differs depending on the weight average molecular weight of the crosslinking-type curing agent. If the number of terminal double bonds is too small, there is a tendency that sufficient heat resistance of the cured product is difficult to be obtained. If the number of terminal double bonds is too large, the reactivity is too high, and, for example, the problems of deterioration in storage stability of the resin composition, and deterioration in fluidity of the resin composition can occur.

In further consideration of the weight average molecular weight of the crosslinking-type curing agent, the number of terminal double bonds of the crosslinking-type curing agent is preferably 2 to 4 when the weight average molecular weight of the crosslinking-type curing agent is less than 500 (100 or more and less than 500). The number of terminal double bonds of the crosslinking-type curing agent is preferably 3 to 20 when the weight average molecular weight of the crosslinking-type curing agent is 500 or more (500 or more and 5000 or less). In each case, if the number of terminal double bonds is less than the lower limit of the above range, there is a possibility that the reactivity of the crosslinking-type curing agent decreases, the crosslink density of the cured product of the resin composition decreases, and the heat resistance and Tg cannot be sufficiently improved. On the other hand, if the number of terminal double bonds is larger than the upper limit of the above range, there is a possibility that the resin composition is easy to gelate.

The number of terminal double bonds can be recognized from the specification of the product of the crosslinking-type curing agent being used. As the number of terminal double bonds, specifically, for example, a numerical value indicating an average value of the number of double bonds per one molecule of all the crosslinking-type curing agent existing in 1 mole of the crosslinking-type curing agent can be recited.

Specific examples of the crosslinking-type curing agent used in the present embodiment include a trialkenyl isocyanurate compound such as triallyl isocyanurate (TAIC), a multifunctional methacrylate compound having two or more methacryl groups in each molecule, a multifunctional acrylate compound having two or more acryl groups in each molecule, a vinyl compound having two or more vinyl groups in each molecule as with polybutadiene (multifunctional vinyl compound), and a vinylbenzyl compound having a vinylbenzyl group in each molecule such as styrene and divinylbenzene. Among these, those having two or more carbon-carbon double bonds in each molecule are preferred. Specific examples include a trialkenyl isocyanurate compound, a multifunctional acrylate compound, a multifunctional methacrylate compound, and a multifunctional vinyl compound. Cross-links would be formed more desirably by the curing reaction using such a crosslinking-type curing agent, and the heat resistance, the adhesiveness, and so on of the cured product of the resin composition according to the present embodiment can be further improved. The crosslinking-type curing agent may be used singly or in combination of two or more kinds from the exemplified crosslinking-type curing agents. As the crosslinking-type curing agent, a combination of a compound having two or more carbon-carbon unsaturated double bonds in each molecule, and a compound having one carbon-carbon unsaturated double bond in each molecule may be used. As the compound having one carbon-carbon unsaturated double bond in each molecule, specifically, a compound having one vinyl group in each molecule (monovinyl compound) can be recited.

The content of the modified polyphenylene ether compound, relative to the total amount of the modified polyphenylene ether compound and the crosslinking-type curing agent is preferably 20% by mass or more and 95% by mass or less, more preferably 30% by mass or more and 90% by mass or less, further preferably 50% by mass or more and 90% by mass or less. The content of the crosslinking-type curing agent, relative to the total amount of the modified polyphenylene ether compound and the crosslinking-type curing agent is preferably 5 to 80% by mass, more preferably 10 to 70% by mass, further preferably 10 to 50% by mass. That is, the content ratio between the modified polyphenylene ether compound and the crosslinking-type curing agent in mass ratio is preferably 95:5 to 20:80, more preferably 90:10 to 30:70, further preferably 90:10 to 50:50. When the respective contents of the modified polyphenylene ether compound and the crosslinking-type curing agent satisfy the above ranges, the resin composition has more excellent Tg, heat resistance, adhesiveness, and low coefficient of thermal expansion of the cured product. This is ascribable to that the curing reaction between the modified polyphenylene ether compound and the crosslinking-type curing agent progresses desirably.

Further, the resin composition of the present embodiment has excellent moldability and low coefficient of thermal expansion, so that the resin composition advantageously little causes bow or the like when applied to a board.

Although the resin composition according to the present embodiment is not particularly limited as long as it includes the modified polyphenylene ether compound (A) and the crosslinking-type curing agent (B), the resin composition according to the present embodiment may further contain other component.

For example, the resin composition according to the present embodiment may further contain a filler. Examples of the filler include, but are not limited to, those added for enhancing the heat resistance and the incombustibility of the cured product of the resin composition. By containing the filler, it is possible to further enhance the heat resistance, the incompatibility, and the so on. Specific examples of the filler include metal oxides including silica such as spherical silica, alumina, titanium oxide, and mica, metal hydroxides such as aluminum hydroxide, and magnesium hydroxide, talc, aluminum borate, barium sulfate, and calcium carbonate. Among these, silica, mica, and talc are preferred, and spherical silica is more preferred as the filler. The filler may be used singly or in combination of two or more kinds. The filler may be used as it is, or may be used while it is surface-treated with a silane coupling agent of epoxy silane type, vinyl silane type, or amino silane type. The silane coupling agent may be added by an integral blending method rather than by the method of preliminarily subjecting the filler to a surface treatment.

When the filler is contained, the content, relative to 100 parts by mass of the total of the organic components (the component (A) and the component (B)), is preferably 10 to 200 parts by mass, and more preferably 30 to 150 parts by mass.

The resin composition of the present embodiment may further contain a flame retarder, and examples of the flame retarder include halogen-based flame retarders such as a bromine-based flame retarder, and phosphorus-based flame retarders. Specific examples of the halogen-based flame retarders include bromine-based flame retarders such as pentabromodiphenylether, octabromodiphenylether, decabromodiphenylether, tetrabromobisphenol A, and hexabromocyclododecane, and chlorine-based flame retarders such as chlorinated paraffin. Specific examples of the phosphorus-based flame retarders include phosphate esters such as condensed phosphate esters, and cyclic phosphate esters, phosphazene compounds such as cyclic phosphazene compounds, phosphinate-based flame retarders such as phosphinic acid metal salts such as dialkylphosphinic acid aluminum salts, melamine-based flame retarders such as melamine phosphate and melamine polyphosphate, and phosphine oxide compounds having a diphenylphosphine oxide group. The flame retarder may be used singly or in combination of two or more kinds from the exemplified flame retarders.

Further, the resin composition according to the present embodiment may further include additives besides the above. Examples of the additives include an antifoaming agent such as a silicone-based antifoaming agent and an acrylate ester-based antifoaming agent, a heat stabilizer, an antistatic agent, a ultraviolet absorber, a dye, a pigment, a lubricant, and a dispersing agent such as a wetting and dispersing agent.

The polyphenylene ether resin composition according to the present embodiment may further contain a reaction initiator. Even when the polyphenylene ether resin composition is composed of a modified polyphenylene ether and a crosslinking-type curing agent, the curing reaction can progress. Also, the curing reaction can progress only by the modified polyphenylene ether. However, since it is sometimes difficult to raise the temperature to such a high temperature that allows progression of curing depending on the process condition, a reaction initiator may be added. The reaction initiator is not particularly limited as long as it can accelerate the curing reaction between the modified polyphenylene ether and the crosslinking-type curing agent. Specific examples include oxidizing agents such as α,α'-bis (t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropylmonocarbonate, and azobisisobutyronitrile. Also, a carboxylic acid metal salt or the like can be used together as needed. This further accelerates the curing reaction. Among these, α,α'-bis(t-butylperoxy-m-isopropyl)benzene is preferably used. Since α,α'-bis(t-butylperoxy-m-isopropyl)benzene has a relatively high reaction initiation temperature, it is possible to control acceleration of the curing reaction when curing is not required, for example at the time of drying of a prepreg, and it is possible to control deterioration in storage stability of the polyphenylene ether resin composition. Further, since α,α'-bis(t-butylperoxy-m-isopropyl)benzene has low volatility, volatilization does not occur at the time of drying of a prepreg or during storage, and excellent stability is achieved. The reaction initiator may be used singly or in combination of two or more kinds. The content of the reaction initiator is preferably 0.1 to 2 parts by mass, relative to 100 parts by mass of (A) terminal modified polyphenylene ether compound.

Next, a prepreg, a metal-clad laminate, a wiring board, and a metal foil with resin using the polyphenylene ether resin composition of the present embodiment are described.

In the drawings used in the description, 1 denotes a prepreg, 2 denotes a resin composition or a semi-cured product of the resin composition, 3 denotes a fibrous base material, 11 denotes a metal-clad laminate, 12 denotes an insulating layer, 13 denotes a metal foil, 14 denotes wiring, 21 denotes a wiring board, 31 denotes a metal foil with resin, 32 and 42 denote resin layers, 41 denotes a film with resin, and 43 denotes a support film.

FIG. 1 is a schematic section view showing one example of the prepreg 1 according to an embodiment of the present invention.

As shown in FIG. 1, the prepreg 1 according to the present embodiment includes the resin composition or the semi-cured product of the resin composition 2, and the fibrous base material 3. In one example of the prepreg 1, the fibrous base material 3 exists in the resin composition or the semi-cured product thereof 2. That is, the prepreg 1 includes the resin composition or the semi-cured product thereof, and the fibrous base material 3 existing in the resin composition or the semi-cured product thereof 2.

In the present embodiment, "semi-cured product" means a product in the state that the resin composition is cured halfway to such an extent that the resin composition can be further cured. That is, the semi-cured product is in such a state that the resin composition is semi-cured (B-staged). For example, as the resin composition is heated, the resin composition gradually becomes less viscous in the beginning, and then starts curing, and gradually becomes more viscous. In such a case, as a "semi-cured" state, the state before completion of curing after starting of increase in viscosity can be recited.

A prepreg obtained by using the resin composition according to the present embodiment may include the semi-cured product of the resin composition, or may include the resin composition itself that is not cured. That is, the prepreg may be a prepreg including the semi-cured product of the resin composition (the resin composition in B stage) and a fibrous base material, or may be a prepreg including the resin composition before curing (the resin composition in A stage) and a fibrous base material. Specific examples include prepregs in which the fibrous base material exists in the resin composition. The resin composition or the semi-cured product thereof may be the resin composition that is dried or heat dried.

The resin composition according to the present embodiment is often prepared into varnish, and used as resin varnish in production of the prepreg, or the later-described metal foil with resin such as RCC, metal-clad laminate, and so on. Such resin varnish is prepared, for example, in the following manner.

First, modified polyphenylene ether compound (A), crosslinking-type curing agent (B), and each component such as a reaction initiator that is soluble in an organic solvent are introduced and dissolved in the organic solvent. At this time, heating may be conducted as needed. Then, a component that is insoluble in the organic solvent, for example, an inorganic filler is added, and then the component is dispersed until a predetermined dispersed state is achieved with a ball mill, a beads mill, a planetary mixer, a roll mill or the like, and thus a varnishy resin composition is prepared. The organic solvent used herein is not particularly limited as long as it dissolves the modified polyphenylene ether compound (A), the crosslinking-type curing agent (B), and so on, and it does not inhibit the curing reaction. Specific examples include toluene, methylethylketone, cyclohexanone, and propylene glycol monomethyl ether acetate. These may be used singly or in combination of two or more kinds.

The resin varnish of the present embodiment is advantageous in that it is excellent in film flexibility, film formability, and impregnating ability to glass cloth, and it is easy to handle.

As a method for producing the prepreg 1 of the present embodiment using the obtained resin varnishy resin composition, for example, a method of impregnating the fibrous base material 3 with the obtained resin varnish resin composition 2, followed by drying is recited.

Specific examples of the fibrous base material used in producing a prepreg include glass cloth, aramid cloth, polyester cloth, LCP (liquid crystal polymer) nonwoven fabric, glass nonwoven fabric, aramid nonwoven fabric, polyester nonwoven fabric, pulp paper, and linter paper. A laminate having excellent mechanical strength is obtained by using glass cloth, and in particular, glass cloth that is subjected to a flattening process is preferred. Although the glass cloth for use in the present embodiment is not particularly limited, for example, glass cloth having low dielectric constant such as E glass, S glass. NE glass, L glass, and Q glass can be recited. The flattening process can be performed, specifically, for example, by compressing yarns into flat by continuously pressurizing the glass cloth at an appropriate pressure by means of a press roll. As the fibrous base material, for example, those having a thickness of 0.01 to 0.3 mm can be generally used.

Impregnation of the fibrous base material 3 with the resin varnish (resin composition 2) is performed by dipping, coating and so on. The impregnation can be repeated plural times as needed. In this case, by repeating impregnation using a plurality of resin varnishes having different compositions or concentrations, a desired composition (content ratio) and a desired resin amount can be eventually achieved.

The fibrous base material 3 impregnated with the resin varnish (resin composition 2) is heated in desired heating conditions, for example, at 80° C. or more and 180° C. or less for 1 minute or more and 10 minutes or less. The solvent is volatilized from the varnish by heating, and the solvent is reduced or removed to give the prepreg 1 before curing (A stage) or in a semi-cured state (B stage).

Figure 4:
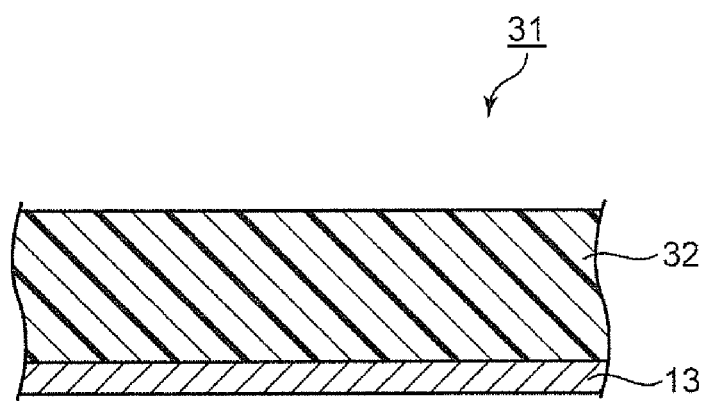
FIG. 4 is a schematic section view showing a configuration of a metal foil with resin according to one embodiment of the present invention.

Also, as shown in FIG. 4, the metal foil with resin 31 of the present embodiment has such a configuration that the resin layer 32 containing the aforementioned resin composition or the semi-cured product of the resin composition, and the metal foil 13 are laminated. That is, the metal foil with resin of the present embodiment may be a metal foil with resin including a resin layer containing the resin composition before curing (the resin composition of A stage), and a metal foil, or may be a metal foil with resin including a resin layer containing the semi-cured product of the resin composition (the resin composition of B stage), and a metal foil. As a method for producing the metal foil with resin 31, for example, a method of coating the surface of the metal foil 13 such as a copper foil with the aforementioned resin varnishy resin composition, followed by drying is recited. Examples of the coating method include a bar coater, a comma coater, a die coater, a roll coater, and a gravure coater. As the metal foil 13, metal foils used in a metal-clad laminate or a wiring board can be used without limitation, and for example, copper foil, aluminum foil, and so on are recited.

Figure 5:
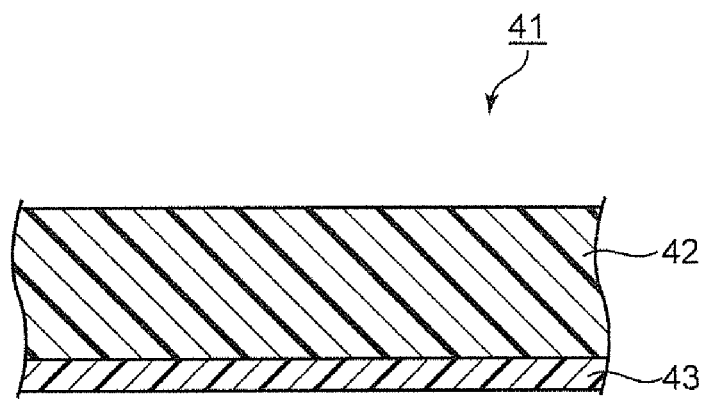
FIG. 5 is a schematic section view showing a configuration of a resin film according to one embodiment of the present invention.

Also, as shown in FIG. 5, the film with resin 41 of the present embodiment has such a configuration that the resin layer 42 containing the aforementioned resin composition or the semi-cured product of the resin composition, and the film support base material 43 are laminated. That is, the film with resin of the present embodiment may be a film with resin containing the resin composition before curing (the resin composition of A stage), and a film support base material, or may be a film with resin containing the semi-cured product of the resin composition (the resin composition of B stage), and a film support base material. As a method for producing the resin film 41, for example, the surface of the film support base material 43 is coated with the aforementioned resin varnishy resin composition, and then the solvent is volatilized from the varnish to reduce or remove the solvent, and thus a film with resin before curing (A stage) or in the semi-cured state (B stage) can be obtained.

Examples of the film support base material include electric insulating films such as a polyimide film, a PET (polyethylene terephthalate) film, a polyester film, a polyparabanic acid film, a polyetherether ketone film, a polyphenylene sulfide film, an aramid film, a polycarbonate film, and a polyarylate film.

Also in the film with resin and the metal foil with resin of the present embodiment, the resin composition or the semi-cured product thereof may be the resin composition that is dried or heat dried as with the case of the prepreg described above.

As the metal foil 13, metal foils used in a metal-clad laminate or a wiring board can be used without limitation, and for example, copper foil, aluminum foil, and so on are recited.

The thickness and so on of the metal foil 13 and the film support base material 43 can be appropriately set in accordance with the desired purpose. For example, as the metal foil 13, those having a thickness of about 0.2 to 70 μm can be used. When the thickness of the metal foil is, for example, 10 μm or less, a copper foil with a carrier, having a release layer and a carrier for improvement in handleability may be employed. Application of the resin varnish to the metal foil 13 or the film support base material 43 is performed by coating or the like, the coating may be repeated plural times as needed. In this case, by repeating coating using a plurality of resin varnishes having different compositions or concentrations, a desired composition (content ratio) and a desired resin amount can be eventually achieved.

Although the drying or heat drying conditions in the production method of the metal foil with resin 31 or the resin film 41 are not particularly limited, the metal foil 13 or the film support base material 43 is coated with the resin varnishy resin composition, and then heating is conducted at desired heating conditions, for example, at 80 to 170° C. for about 1 to 10 minutes to volatile the solvent from the varnish to reduce or remove the solvent, and thus the metal foil with resin 31 or the resin film 41 before curing (A stage) or in the semi-cured state (B stage) is obtained.

The metal foil with resin 31 or the resin film 41 may further include a cover film and so on as needed. By the cover film, contamination and so on can be prevented. Although the cover film is not particularly limited as long as it can be peeled off without impairment of the form of the resin composition, and for example, a polyolefin film, a polyester film, a TPX film, films formed by providing these films with a release agent layer, and paper sheets prepared by laminating these films on a paper base material can be used.

Figure 2:
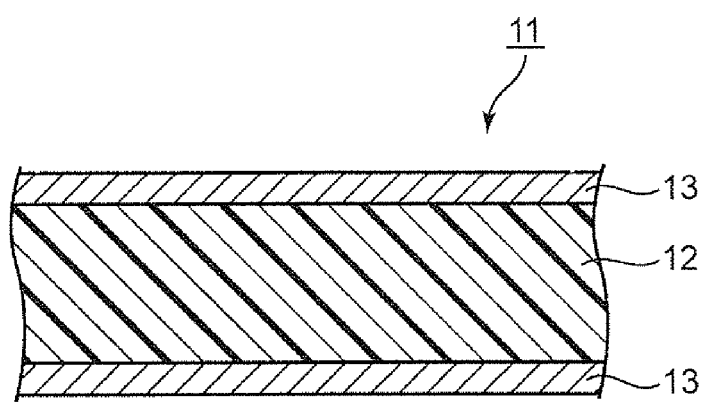
FIG. 2 is a schematic section view showing a configuration of a metal-clad laminate according to one embodiment of the present invention.

As shown in FIG. 2, the metal-clad laminate 11 of the present embodiment has the insulating layer 12 containing a cured product of the aforementioned resin composition or a cured product of the aforementioned prepreg, and the metal foil 13. As the metal foil 13 for use in the metal-clad laminate 11, the one that is the same as the metal foil 13 described above can be used.

The metal-clad laminate 11 of the present embodiment can also be prepared by using the metal foil with resin 31 or the resin film 41 as described above.

As a method for producing a metal-clad laminate using the prepreg 1, the metal foil with resin 31, or the resin film 41 obtained in the manner as described above, one or a plurality of the prepreg 1, the metal foil with resin 31 or the resin film 41 are stacked, and the metal foil 13 such as a copper foil is stacked on either or both of the upper and lower surfaces, and the stack is heating and pressurizing molded to give an integrated laminate, and thus a double face metal foil-clad laminate or a single face metal foil-clad laminate can be prepared. Although the heating and pressurizing conditions can be appropriately set depending on the thickness of the laminate to be produced, the kind of the resin composition and so on, for example, the temperature can be 170 to 220° C., the pressure can be 1.5 to 5.0 MPa, and the time can be 60 to 150 minutes.

The metal-clad laminate 11 may also be prepared by forming the film-like resin composition on the metal foil 13, and performing heating and pressurizing without using the prepreg 1.

Figure 3:
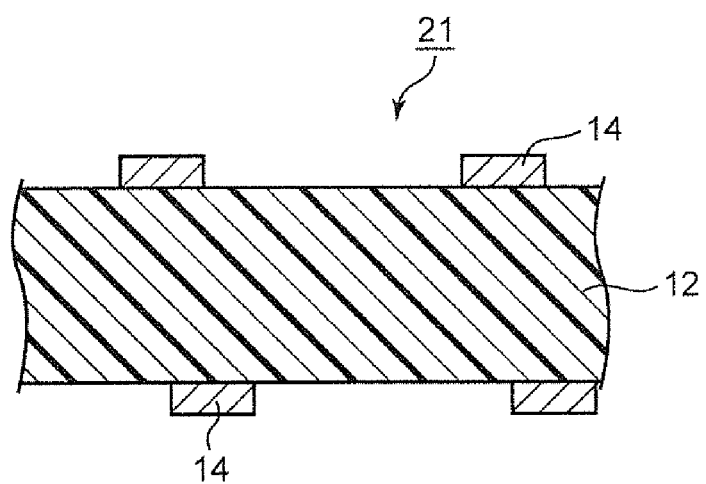
FIG. 3 is a schematic section view showing a configuration of a wiring board according to one embodiment of the present invention.

As shown in FIG. 3, the wiring board 21 of the present embodiment has the insulating layer 12 containing a cured product of the aforementioned resin composition or a cured product of the aforementioned prepreg, and the wiring 14.

As a method for producing the wiring board 21, for example, by forming a circuit (wiring) by etching the metal foil 13 of the surface of the metal-clad laminate 13 obtained in the above, it is possible to obtain the wiring board 21 having a conductor pattern (wiring 14) provided as a circuit on the surface of the laminate. As a method for forming a circuit, circuit formation according to a semi additive process (SAP) or a modified semi additive process (MSAP) can be recited besides the method as described above.

Since the prepreg, the film with resin, and the metal foil with resin obtained by using the resin composition of the present embodiment have high heat resistance, high Tg, and adhesiveness in addition to low dielectric characteristics, they are very useful in industrial applications. Also, since they have a low coefficient of thermal expansion, they little cause bow or the like, and have excellent moldability. Also, the metal-clad laminate and the wiring board produced by curing these have high heat resistance, high Tg, high adhesiveness, and low bowing property.

While the present description discloses the techniques of various aspects as described above, the principal techniques thereof are summarized below.

A polyphenylene ether resin composition according to one aspect of the present invention includes:

(A) a modified polyphenylene ether compound that is terminally modified with a substituent having a carbon-carbon unsaturated double bond, and (B) a crosslinking-type curing agent having two or more carbon-carbon unsaturated double bonds in each molecule, the modified polyphenylene ether compound (A) including (A-1) a modified polyphenylene ether compound represented by formula (1), and (A-2) a modified polyphenylene ether compound represented by formula (2).

[Chemical formula 18]

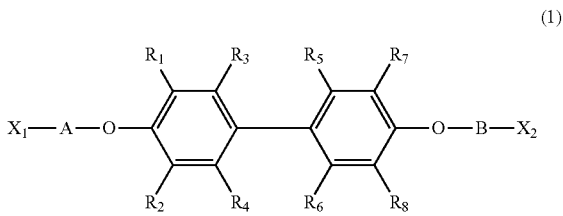

(1)

[Chemical formula 19]

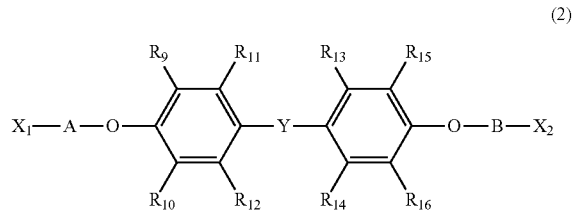

(2)

(In formulas (1) and (2), $R_1$ to $R_8$ and $R_9$ to $R_{16}$ each independently represent a hydrogen atom, an alkyl group, an alkenyl group, an alkynyl group, a formyl group, an alkylcarbonyl group, an alkenylcarbonyl group, or an alkynylcarbonyl group. Y represents a linear, branched, or cyclic hydrocarbon having 20 or less carbon atoms. $X_1$ and $X_2$, which may be the same or different from each other, represent a substituent having a carbon-carbon unsaturated double bond.

A and B respectively represent structures shown by formulas (3) and (4):

[Chemical formula 20]

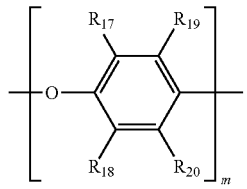

(3)

[Chemical formula 21]

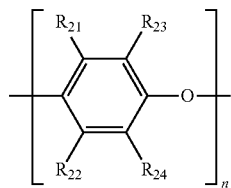

(4)

In formulas (3) and (4), m and n each represent an integer of 0 to 20. $R_{17}$ to $R_{20}$ and $R_{21}$ to $R_{24}$ each independently represent a hydrogen atom or an alkyl group.)

By such a configuration, it is possible to provide a resin composition having high heat resistance, high Tg, and adhesiveness in addition to low dielectric characteristics, and further having a low coefficient of thermal expansion.

In the aforementioned polyphenylene ether resin composition, it is preferred that Y in formula (2) is a group represented by formula (5).

[Chemical formula 22]

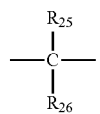

(5)

(In formula (5), $R_{25}$ and $R_{26}$ each independently represent a hydrogen atom or an alkyl group.)

This would provide the aforementioned effect more securely.

Further, in the aforementioned polyphenylene ether resin composition, it is preferred that $X_1$ and $X_2$ in formula (1) and formula (2) are substituents represented by formula (6) or formula (7).

[Chemical formula 23]

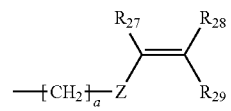

(6)

(In formula (6), a represents an integer of 0 to 10. Z represents an arylene group. $R_{27}$ to $R_{29}$ each independently represent a hydrogen atom or an alkyl group.)

[Chemical formula 24]

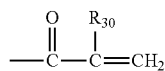

(7)

(In formula (7), $R_{30}$ represents a hydrogen atom or an alkyl group.)

This would securely provide the resin composition having high Tg, excellent heat resistance, and adhesiveness in addition to low dielectric characteristics.

Further, in the polyphenylene ether resin composition, it is preferred that the crosslinking-type curing agent (B) is at least one selected from the group consisting of a trialkenylisocyanurate compound, a multifunctional acrylate compound having two or more acryl groups in each molecule, a multifunctional methacrylate compound having two or more methacryl groups in each molecule, and a multifunctional vinyl compound having two or more vinyl groups in each molecule. This would further improve the heat resistance, Tg, and adhesiveness.

In the polyphenylene ether resin composition, it is preferred that the modified polyphenylene ether compound (A-1) and the modified polyphenylene ether compound (A-2) are contained in a content of 20 to 95% by mass, relative to the total amount of the modified polyphenylene ether compound (A) and the crosslinking-type curing agent (B). This would provide the aforementioned effect more securely.

Further, in the modified polyphenylene ether compound (A). it is preferred that the content ratio between the modified polyphenylene ether compound (A-1) and the modified polyphenylene ether compound (A-2) is (A-1):(A-2)=5:95 to 95:5 by mass ratio. This would provide the aforementioned effect more securely.

A prepreg according to another aspect of the present invention includes the aforementioned resin composition or a semi-cured product of the resin composition, and a fibrous base material.

A film with resin according to another aspect of the present invention includes a resin layer containing the aforementioned resin composition or a semi-cured product of the resin composition, and a support film.

A metal foil with resin according to another aspect of the present invention includes a resin layer containing the aforementioned resin composition or a semi-cured product of the resin composition, and a metal foil.

A metal-clad laminate according to another aspect of the present invention includes an insulating layer containing a cured product of the aforementioned resin composition or a cured product of the aforementioned prepreg, and a metal foil.

A wiring board according to another aspect of the present invention includes an insulating layer containing a cured product of the aforementioned resin composition or a cured product of the aforementioned prepreg, and wiring.

According to the aforementioned configuration, it is possible to obtain a metal foil with resin, a metal-clad laminate, a wiring board and so on having low dielectric characteristics, high Tg, high heat resistance, and excellent adhesiveness, and capable of suppressing bow of the obtained board.

In the following, the present invention is described more specifically by examples, however, it is to be noted that the scope of the present invention is not limited to these examples.

EXAMPLES

In the present example, components used in preparing a resin composition are described.

<(A) Component: Polyphenylene Ether>

(A-1)

OPE-2St 1200: terminal vinylbenzyl modified PPE (Mw: approximately 1600, available from MITSUBISHI GAS CHEMICAL COMPANY, INC.), which is a modified polyphenylene ether compound represented by formula (9).

OPE-2St 2200: terminal vinylbenzyl modified PPE (Mw: approximately 3600, available from MITSUBISHI OAS CHEMICAL COMPANY, INC.), which is a modified polyphenylene ether compound represented by formula (9).

(A-2)

Modified PPE-1: bifunctional vinylbenzyl modified PPE (Mw: 1900)

First, a modified polyphenylene ether (modified PPE-1) was synthesized. An average number of phenolic hydroxyl groups at the molecular terminal per one molecule of polyphenylene ether is indicated by a number of terminal hydroxyl groups.

Polyphenylene ether and chloromethylstyrene were reacted to give modified polyphenylene ether 1 (modified PPE-1). Specifically, first, a 1-L three-necked flask equipped with a temperature controller, a stirrer, a cooler, and a dropping funnel was charged with 200 g of polyphenylene ether (SA90 available from SABIC Innovative Plastics, intrinsic viscosity (IV) 0.083 dl/g, number of terminal hydroxyl groups: 1.9, weight molecular weight Mw: 1700), 30 g of a mixture of p-chloromethylstyrene and m-chloromethylstyrene in a mass ratio of 50:50 (chloromethylstyrene available from TOKYO CHEMICAL INDUSTRY CO., LTD.: CMS), 1.227 g of tetra-n-butylammonium bromide as a phase transfer catalyst, and 400 g of toluene, and stirred. Then, the mixture was stirred until polyphenylene ether, chloromethylstyrene, and tetra-n-butylammonium bromide were dissolved in toluene. At this time, the mixture was gradually heated and heated until the liquid temperature finally reached 75° C. Then, to the resultant solution, a sodium hydroxide aqueous solution (sodium hydroxide 20 g/water 20 g) as an alkali metal hydroxide was dropped over 20 minutes. Thereafter, the solution was further stirred at 75° C. for 4 hours. Then, after neutralizing the contents of the flask with 10% by mass of hydrochloric acid, a large amount of methanol was introduced. This made the liquid in the flask generate a precipitate. That is, the product contained in the reaction solution in the flask was reprecipitated. Then, the precipitate was taken out by filtration, and washed three times with a mixture of methanol and water in a mass ratio of 80:20, and dried at 80° C. for 3 hours under reduced pressure.

The obtained solid was analyzed by $^1$H-NMR (400 MHz, CDCl3, TMS). In the measurement result of NMR, a peak originating from ethenylbenzyl was observed at 5 to 7 ppm. This demonstrated that the obtained solid was polyphenylene ether of which terminal was ethenylbenzylated.

The molecular weight distribution of the modified polyphenylene ether was determined by using OPC. From the obtained molecular weight distribution, a weight average molecular weight (Mw) was calculated. Mw was 1900.

Also, the number of terminal functional groups of the modified polyphenylene ether was determined in the following manner.

First, the modified polyphenylene ether was accurately weighed. The weight at this time is X (mg). Then, the weighed modified polyphenylene ether was dissolved in 25 mL of methylene chloride, and to the resultant solution, 100 µL of a 10% by mass solution of tetraethylammonium hydroxide (TEAH) in ethanol (TEAH:ethanol (volume ratio)=15:85) was added, and absorbance (Abs) at 318 nm was measured by using an UV spectrophotometer (UV-1600 available from Shimadzu Corporation). Then from the measurement result, the number of terminal hydroxyl groups of the modified polyphenylene ether was calculated using the following formula.

$$\text{Residual OH quantity (µmol/g)} = [(25 \times \text{Abs}) / (\varepsilon \times OPL \times X)] \times 10^6$$

In the present specification, $\varepsilon$ represents an extinction coefficient, and is 4700 L/mol·cm. OPL represents a cell optical path length, and is 1 cm.

The calculated residual OH quantity (the number of terminal hydroxyl groups) of the modified polyphenylene ether was almost zero, revealing that almost all the hydroxyl groups of the polyphenylene ether before modification were modified. This revealed that the decrement from the number of terminal hydroxyl groups of the polyphenylene ether before modification was the number of terminal hydroxyl groups of the polyphenylene ether before modification. In other words, it was revealed that the number of terminal hydroxyl groups of the polyphenylene ether before modification was the number of terminal functional groups of the modified polyphenylene ether. That is, the number of terminal functional groups was 1.8.

The obtained modified polyphenylene ether is a modified polyphenylene ether compound represented by formula (10).

SA-9000: bifunctional methacrylate modified PPE (Mw: 1700, available from SABIC), which is a modified polyphenylene ether compound represented by formula (11).

(Thermoplastic Elastomer)

TR2003: styrene-butadiene-styrene copolymer (Mw: 100000, available from JSR Corporation)

BI-3000: hydrogenated polybutadiene (Mn: 3300, available from NIPPON SODA CO., LTD.)

<(B) Component: Crosslinking-Type Curing Agent>

DCP: dicyclopentadiene type methacrylate (available from Shin-Nakamura Chemical Co., Ltd., molecular weight: 332, number of terminal double bonds: 2)

DVB810: divinylbenzene (available from NIPPON STEEL CORPORATION, molecular weight: 130, number of terminal double bonds: 2

B-1000: polybutadiene oligomer (available from NIPPON SODA CO., LTD., weight average molecular weight Mw: 1100, number of terminal double bonds: 15)

FA-513M: dicyclopentanyl methacrylate (available from Hitachi Chemical Company, Ltd., molecular weight: 220, number of terminal double bonds: 1)

<Other Components>

(Reaction Initiator)

PERBUTYL P: 1,3-bis(butylperoxyisopropyl)benzene (available from NOF CORPORATION)

(Inorganic Filler)

SC2500-SXJ: phenylaminosilane surface treated spherical silica (available from Admatechs Company Limited)

Examples 1 to 20, Comparative Examples 1 to 8

[Preparation Method] (Resin Varnish)

First, components were added to toluene in a blending ratio described in Tables 1 and 2 so that the solid content concentration was 60% by mass, and mixed. By stirring the mixture for 60 minutes, a varnishy resin composition (varnish) was obtained.

(Prepreg)

After impregnating glass cloth (available from Asahi Kasei Corporation, #2116 type, E glass) with a resin varnish of each of Examples and Comparative Examples, the prepreg was heat dried at 100 to 170° C. for about 3 to 6 minutes to give a prepreg. At that time, the content of the resin composition (resin content) relative to the weight of the prepreg was adjusted to about 45% by mass.

(Copper-Clad Laminate)

On both sides of one sheet of the prepreg, a copper foil having a thickness of 12 μm (GT-MP, available from FURUKAWA ELECTRIC CO., LTD.) was disposed to give an object to be compressed, and the object was heated and pressurized at a temperature of 200° C., with a pressure of 40 kgf/cm² in vacuo for 120 minutes to give a copper-clad laminate I having a thickness 0.1 mm to which copper foils are adhered on both sides. Also, eight sheets of the prepreg were stacked, and a copper-clad laminate II having a thickness of 0.8 mm was obtained in the same manner as described above.

<Evaluation Tests>

(Glass Transition Temperature (Tg))

The whole surface of the outer layer copper foil of the copper-clad laminate I was etched, and for the obtained sample, Tg was measured by using a viscoelasticity spectrometer "DMS100" available from Seiko Instruments Inc. At this time, dynamic viscoelasticity measurement (DMA) was performed by a tensile module at a frequency of 10 Hz, and the temperature at which tan δ showed the maximum when the temperature was elevated to 280° C. from the room temperature at a temperature elevation rate of 5° C./min was determined as Tg.

(Oven Heat Resistance)

Heat resistance was evaluated according to the standard of JIS C 6481 (1996). The copper-clad laminate I cut out into a predetermined size was left to stand in a thermostatic bath set at 280° C. and 290° C. for 1 hour, and then taken out. The heat treated test piece was visually observed, and evaluated as "Excellent" when a blister was not generated at 290° C., "Good" when a blister was generated at 290° C. but not at 280° C., and "Poor" when a blister was generated at 280° C.

(Coefficient of Thermal Expansion (CTE))

The copper foil was removed from the copper-clad laminate II to make a test piece, and for the test piece, the coefficient of thermal expansion in the Z-axial direction at a temperature less than. the glass transition temperature of the resin cured product was measured by Thermo-mechanical analysis (TMA) method according to JIS C 6481. The measurement was performed in the range of 30 to 300° C. using a TMA apparatus ("TMA6000" available from SII Nano Technology). The measurement unit is ppm/° C.

(Copper Foil Adhesivity)

In the copper-clad laminate I, copper foil peel strength of copper foil from the insulating layer was measured in accordance with JIS C 6481. A pattern of 10 mm wide and 100 mm long was formed, and tearing was performed at a rate of 50 mm/min with a tensile tester, and a tearing strength (peel strength) at this time was measured, and the peel strength was determined as a copper foil adhesion strength. The measurement unit was kN/m.

(Dielectric Characteristics: Dielectric Loss Tangent (Df))

A laminate obtained by removing the copper foil from the copper-clad laminate II was used as an evaluation board, and a dielectric loss tangent (Df) was measured by a cavity resonator perturbation method. Specifically, a dielectric loss tangent of the evaluation board at 10 GHz was measured by using a network analyzer (N5230A available from Agilent Technologies, Inc.

These results are shown in Table 1 to Table 3.

TABLE 1

| | | | Example 1 | Example 2 | Example 3 | Example 4 | Example 5 | Example 6 | Example 7 | Example 8 | Example 9 | Example 10 |
|---|---|---|---|---|---|---|---|---|---|---|---|---|
| Modified PPE (A) | (A-1) | OPE-2St 1200 | 35 | 47.5 | 45 | 35 | 25 | 15 | 10 | 3.5 | 7 | 14 |
| | | OPE-2St 2200 | | | | | | | | | | |
| | (A-2) | Modified PPE-1 | 35 | 47.5 | 45 | 35 | 25 | 15 | 10 | 66.5 | 63 | 56 |
| | | SA9000 | | | | | | | | | | |
| Thermoplastic elastomer | | TR2003 | | | | | | | | | | |
| | | B1-3000 | | | | | | | | | | |
| Curing agent (B) | | DCP | 30 | 5 | 10 | 30 | 50 | 70 | 80 | 30 | 30 | 30 |
| | | DVB810 | | | | | | | | | | |
| | | B-1000 | | | | | | | | | | |
| | | FA-513M | | | | | | | | | | |
| Reaction initiator | | PERBUTYL P | | 1 | 1 | 1 | 1 | 1 | 1 | 1 | 1 | 1 |
| Inorganic filler | | SC2500-SXJ | 100 | 100 | 100 | 100 | 100 | 100 | 100 | 100 | 100 | 100 |
| Tg | | ° C. | 230 | 220 | 230 | 250 | 245 | 255 | 260 | 225 | 230 | 240 |
| Oven heat resistance | | — | Excellent | Good | Excellent | Excellent | Excellent | Excellent | Excellent | Excellent | Excellent | Excellent |

TABLE 1-continued

|  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|
| CTE | ppm/°C | 40 | 40 | 35 | 35 | 30 | 27 | 25 | 38 | 37 | 35 |
| Copper foil adhesivity | kN/m | 0.60 | 0.60 | 0.65 | 0.70 | 0.65 | 0.55 | 0.50 | 0.75 | 0.75 | 0.75 |
| Df @ 10 GHz | — | 0.004 | 0.0043 | 0.0045 | 0.005 | 0.0055 | 0.006 | 0.065 | 0.005 | 0.005 | 0.005 |

TABLE 2

|  |  |  | Example 11 | Example 12 | Example 13 | Example 14 | Example 15 | Example 16 | Example 17 | Example 18 | Example 19 | Example 20 |
|---|---|---|---|---|---|---|---|---|---|---|---|---|
| Modified PPE (A) | (A-1) | OPE-2St 1200 | 21 | 49 | 56 | 63 | 66.5 | 35 | 35 | 35 |  | 35 |
|  |  | OPE-2St 2200 |  |  |  |  |  |  |  |  | 35 |  |
|  | (A-2) | Modified PPE-1 | 49 | 21 | 14 | 7 | 3.5 | 35 | 33 | 35 | 35 |  |
|  |  | SA9000 |  |  |  |  |  |  |  |  |  | 35 |
| Thermoplastic elastomer |  | TR2003 |  |  |  |  |  |  |  |  |  |  |
|  |  | B1-3000 |  |  |  |  |  |  |  |  |  |  |
| Curing agent (B) |  | DCP | 30 | 30 | 30 | 30 | 30 |  |  | 15 | 15 | 30 |
|  |  | DVB810 |  |  |  |  |  | 30 |  |  |  |  |
|  |  | B-1000 |  |  |  |  |  |  | 30 | 15 | 15 |  |
|  |  | FA-513M |  |  |  |  |  |  |  |  |  |  |
| Reaction initiator |  | PERBUTYL P | 1 | 1 | 1 | 1 | 1 | 1 | 1 | 1 | 1 | 1 |
| Inorganic filler |  | SC2500-SXJ | 100 | 100 | 100 | 100 | 100 | 100 | 100 | 100 | 100 | 100 |
| Tg | °C |  | 245 | 250 | 250 | 250 | 250 | 250 | 250 | 250 | 245 | 255 |
| Oven heat resistance | — |  | Excellent | Excellent | Excellent | Excellent | Excellent | Excellent | Excellent | Excellent | Excellent | Excellent |
| CTE | ppm/°C |  | 35 | 35 | 34 | 34 | 34 | 35 | 35 | 35 | 37 | 35 |
| Copper foil adhesivity | kN/m |  | 0.70 | 0.65 | 0.60 | 0.60 | 0.50 | 0.70 | 0.70 | 0.70 | 0.70 | 0.70 |
| Df @ 10 GHz | — |  | 0.005 | 0.005 | 0.005 | 0.005 | 0.005 | 0.005 | 0.005 | 0.005 | 0.005 | 0.0055 |

TABLE 3

|  |  |  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|---|
| Modified PPE (A) | (A-1) | OPE-2St 1200 | 50 | 70 |  | 35 | 35 |  |  | 35 |
|  |  | OPE-2St 2200 |  |  |  |  |  |  |  |  |
|  | (A-2) | Modified PPE-1 | 50 |  | 70 |  |  | 35 | 35 | 35 |
|  |  | SA9000 |  |  |  |  |  |  |  |  |
| Thermoplastic elastomer |  | TR2003 |  |  |  | 35 |  | 35 |  |  |
|  |  | B1-3000 |  |  |  |  | 35 |  | 35 |  |
| Curing agent (B) |  | DCP |  | 30 | 30 | 30 | 30 | 30 | 30 |  |
|  |  | DVB810 |  |  |  |  |  |  |  |  |
|  |  | B-1000 |  |  |  |  |  |  |  |  |
|  |  | FA-513M |  |  |  |  |  |  |  | 30 |
| Reaction initiator |  | PERBUTYL P | 1 | 1 | 1 | 1 | 1 | 1 | 1 | 1 |
| Inorganic filler |  | SC2500-SXJ | 100 | 100 | 100 | 100 | 100 | 100 | 100 | 100 |
| Tg | °C |  | 190 | 250 | 210 | 180 | 180 | 170 | 170 | 200 |

TABLE 3-continued

|  |  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Oven heat resistance | — | — | Poor | Excellent | Excellent | Poor | Poor | Poor | Poor | Good |
| CTE | ppm/° C. | 46 | 33 | 38 | 55 | 52 | 54 | 55 | 45 |
| Copper foil adhesivity | kN/m | 0.35 | 0.40 | 0.75 | 0.60 | 0.60 | 0.70 | 0.70 | 0.40 |
| Df@ 10 GHz | — | 0.004 | 0.005 | 0.005 | 0.005 | 0.005 | 0.005 | 0.005 | 0.005 |

(Discussion)

As is apparent from the results shown in Table 1 to Table 3, it was revealed that the present invention can provide a polyphenylene ether resin composition having high heat resistance, high Tg (220° C. or more) and excellent adhesiveness (peel strength 0.5 kN/m or more) in addition to low dielectric characteristics. Further, in any example, the coefficient of thermal expansion (CTE) was as low as 40° C./ppm or less.

In particular, it was found that an excellent resin composition can be obtained more securely by adjusting the ratio between the component (A) and the component (B) into a specific range, or by setting the mixing ratio between (A-1) modified polyphenylene ether compound and (A-2) modified polyphenylene ether compound in the component (A) within a specific range.

In contrast, in Comparative Example 1 not containing a crosslinking-type curing agent which is (B) component of the present invention, Tg was low, heat resistance was not obtained, and CTE was high. Comparative Example 2 not containing (A-2) component of the present invention was inferior in adhesiveness, and in Comparative Example 3 not containing (A-1) component, Tg decreased.

Comparative Examples 4 to 5 containing a thermoplastic elastomer as an alternative to (A-1) component, and Comparative Examples 6 to 7 containing a thermoplastic elastomer as an alternative to (A-2) component were inferior in all of Tg, heat resistance and CTE.

Further, Comparative Example 8 containing a monofunctional crosslinking-type curing agent in place of the crosslinking-type curing agent which is (B) component of the present invention was inferior in Tg and CTE.

The present application is based on Japanese Patent Application No. 2017-254635 filed on Dec. 28, 2017, and the content thereof is incorporated in the present application.

While the present invention has been described appropriately and sufficiently in the above through the embodiments by referring to specific examples and so on for expressing the present invention, it is to be recognized that a person skilled in the art can easily change and/or modify the aforementioned embodiments. Therefore, it is interpreted that a changed form or a modified form made by a person skilled in the art is encompassed in the scope of a claim unless the changed form or the modified form departs from the scope of the claim disclosed in the claim.

INDUSTRIAL APPLICABILITY

The present invention has broad industrial applicability in technical fields concerning electronic materials and various devices using the same.

The invention claimed is:

1. A polyphenylene ether resin composition comprising:

a modified polyphenylene ether compound (A) that is terminally modified with a substituent having a carbon-carbon unsaturated double bond, and a crosslinking curing agent (B) distinct from the modified polyphenylene ether compound (A) and having two or more carbon-carbon unsaturated double bonds in each molecule;

the modified polyphenylene ether compound (A) including a modified polyphenylene ether compound (A-1) represented by formula (1), and a modified polyphenylene ether compound (A-2) represented by formula (2):

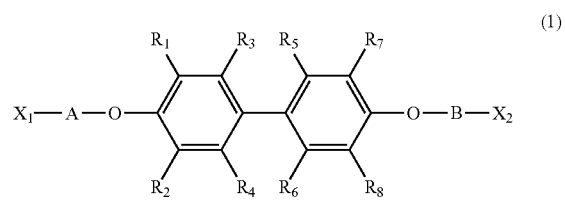

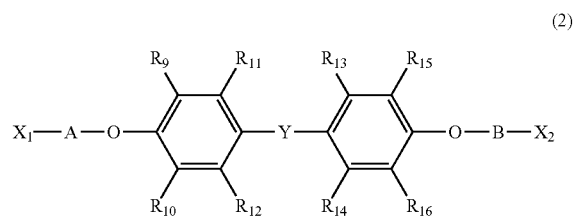

wherein in formulas (1) and (2), $R_1$ to $R_8$ and $R_9$ to $R_{16}$ each independently represent a hydrogen atom, an alkyl group, an alkenyl group, an alkynyl group, a formyl group, an alkylcarbonyl group, an alkenylcarbonyl group, or an alkynylcarbonyl group; Y represents a linear, branched or cyclic hydrocarbon having 20 or less carbon atoms; $X_1$ and $X_2$ may be the same or different from each other, and each represent a substituent having a carbon-carbon unsaturated double bond; and A and B respectively represent structures shown by formulas (3) and (4):

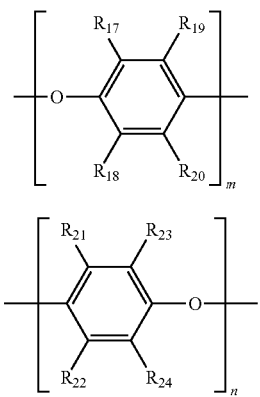

wherein in formulas (3) and (4), m and n each represent an integer of 0 to 20, and $R_{17}$ to $R_{20}$ and $R_{21}$ to $R_{24}$ each independently represent a hydrogen atom or an alkyl group;

wherein in the modified polyphenylene ether compound (A), the content ratio between the modified polyphenylene ether compound (A-1) and modified polyphenylene ether compound (A-2) is (A-1): (A-2)=95:5 to 70:30, and wherein the Tg of a cured product of the resin composition is 220° C. or more.

2. The polyphenylene ether resin composition according to claim 1, wherein in formula (2), Y is a group represented by formula (5):

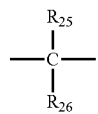

wherein in formula (5), $R_{25}$ and $R_{26}$ each independently represent a hydrogen atom or an alkyl group.

3. The polyphenylene ether resin composition according to claim 1, wherein in formula (1) and formula (2), $X_1$ and $X_2$ are substituents represented by formula (6) or formula (7)

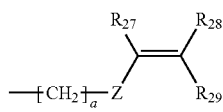

wherein in formula (6), a represents an integer of 0 to 10, Z represents an arylene group, and $R_{27}$ to $R_{29}$ each independently represent a hydrogen atom or an alkyl group,

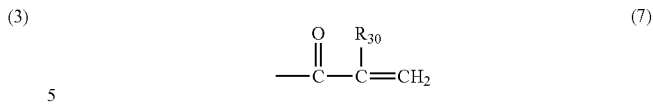

wherein in formula (7), $R_{30}$ represent a hydrogen atom or an alkyl group.

4. The polyphenylene ether resin composition according to claim 1, wherein the crosslinking curing agent (B) contains at least one selected from the group consisting of a trialkenylisocyanurate compound, a multifunctional acrylate compound having two or more acryl groups in each molecule, a multifunctional methacrylate compound having two or more methacryl groups in each molecule, and a multifunctional vinyl compound having two or more vinyl groups in each molecule.

5. The polyphenylene ether resin composition according to claim 1, wherein the modified polyphenylene ether compound (A-1) and the modified polyphenylene ether compound (A-2) are contained in a content of 20 to 95% by mass, relative to a total amount of the modified polyphenylene ether compound (A) and the crosslinking curing agent (B).

6. A prepreg comprising:
the polyphenylene ether resin composition according to claim 1, or a semi-cured product of the resin composition; and
a fibrous base material.

7. A metal-clad laminate, comprising:
an insulating layer containing a cured product of the prepreg according to claim 6; and
a metal foil.

8. A wiring board, comprising:
an insulating layer containing a cured product of the prepreg according to claim 6; and wiring.

9. A film with resin, comprising:
a resin layer containing
the polyphenylene ether resin composition according to claim 1, or
a semi-cured product of the resin composition; and
a support film.

10. A metal foil with resin, comprising:
a resin layer containing
the polyphenylene ether resin composition according to claim 1, or
a semi-cured product of the resin composition; and
a metal foil.

11. A metal-clad laminate, comprising:
an insulating layer containing a cured product of the polyphenylene ether resin composition according to claim 1; and
a metal foil.

12. A wiring board, comprising:
an insulating layer containing a cured product of the polyphenylene ether resin composition according to claim 1; and
wiring.

* * * * *